US011355901B1

(12) United States Patent
Ginzburg et al.

(10) Patent No.: US 11,355,901 B1
(45) Date of Patent: Jun. 7, 2022

(54) COMPACT VERTICAL CAVITY SURFACE EMITTING LASER PACKAGE

(71) Applicant: Facebook Technologies, LLC, Menlo Park, CA (US)

(72) Inventors: Jonatan Ginzburg, Sunnyvale, CA (US); Mark Timothy Sullivan, Mountain View, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 386 days.

(21) Appl. No.: 16/725,365

(22) Filed: Dec. 23, 2019

Related U.S. Application Data (60) Provisional application No. 62/902,289, filed on Sep. 18, 2019.

(51) Int. Cl.
| | |
|---|---|
| *H01S 5/183* | (2006.01) |
| *H01S 5/0235* | (2021.01) |
| *H01S 5/024* | (2006.01) |
| *H01S 5/023* | (2021.01) |
| *H01S 5/0233* | (2021.01) |
| *H01S 5/40* | (2006.01) |

(52) U.S. Cl.
CPC .............. *H01S 5/183* (2013.01); *H01S 5/023* (2021.01); *H01S 5/0233* (2021.01); *H01S 5/0235* (2021.01); *H01S 5/02461* (2013.01); *H01S 5/02469* (2013.01); *H01S 5/4025* (2013.01)

(58) Field of Classification Search
CPC ........ H01S 5/183; H01S 5/023; H01S 5/0233; H01S 5/0235; H01S 5/02461; H01S 5/02469; H01S 5/4025
See application file for complete search history.

(56) References Cited

U.S. PATENT DOCUMENTS

2011/0044369 A1* 2/2011 Andry .................. G02B 6/4204
257/E31.127

* cited by examiner

*Primary Examiner* — Yuanda Zhang
(74) *Attorney, Agent, or Firm* — Fenwick & West LLP (57) ABSTRACT

A vertical cavity surface emitting laser (VCSEL) die package includes a bottom substrate comprising a bottom contact pad electrically contacting a bottom electrode on a bottom surface of a VCSEL die. The VCSEL die package includes a submount including a submount contact pad electrically contacting a first electrode on another surface of the VCSEL die. The submount contact pad overlaps a portion of the first electrode, wherein the VCSEL die is positioned between the submount and the bottom substrate.

22 Claims, 5 Drawing Sheets

```
┌─────────────────────────────────────────────────────────────────┐
│ Couple VCSEL die to bottom substrate of a using a conductive    │
│ glue, electrically coupling a bottom electrode of the VCSEL die │
│ to a bottom contact pad                                         │
│                              510                                │
└─────────────────────────────────────────────────────────────────┘
                                 │
                                 ▼
┌─────────────────────────────────────────────────────────────────┐
│ Position submount over VCSEL die and align submount contact     │
│ pads with respect to first electrodes of the VCSEL die          │
│                              520                                │
└─────────────────────────────────────────────────────────────────┘
                                 │
                                 ▼
┌─────────────────────────────────────────────────────────────────┐
│ Electrically couple submount contact pads to first electrodes   │
│ of the VCSEL die                                                │
│                              530                                │
└─────────────────────────────────────────────────────────────────┘
```

FIG. 5

COMPACT VERTICAL CAVITY SURFACE EMITTING LASER PACKAGE

CROSS-REFERENCE TO RELATED APPLICATIONS

This application claims the benefit of and priority to U.S. Provisional Application No. 62/902,289, filed Sep. 18, 2019, the entire contents of which are hereby incorporated by reference in their entirety.

FIELD OF THE INVENTION

This disclosure relates generally to die packages, and more specifically to vertical cavity surface emitting laser (VCSEL) die packages.

BACKGROUND

Generally, conventional methods for electrically contacting electrodes of a semiconductor die including a vertical cavity surface emitting laser (VCSEL) involve die bonding and/or wire bonding. In cases where electrodes on a top surface and/or side surface of the VCSEL die need to be contacted, a package for the VCSEL die may require additional space to accommodate wires which connect the top electrodes of the VCSEL die to electrical contacts and/or traces on the package. Additionally, assembling VCSEL dies with packages that use wire bonding processes may have relatively low yields. In applications that require a minimal form factor for the VCSEL die and the package for the VCSEL die, a method and package for electrically coupling to the VCSEL die that minimizes the size of the package is desirable.

SUMMARY

A vertical cavity surface emitting laser (VCSEL) die package contains a VCSEL die and electrically couples to electrodes of the VCSEL die without using wire bonding. The VCSEL die package includes a bottom substrate comprising a bottom contact pad electrically coupling to a bottom electrode on a bottom surface of a VCSEL die and a submount including a submount contact pad electrically coupled to a first electrode on another surface of the VCSEL die. The submount contact pad overlaps a portion of the first electrode, wherein the VCSEL die is positioned between the submount and the bottom substrate. In some embodiments, the submount and the bottom substrate form an enclosure surrounding and containing the VCSEL die. An aperture is defined in the submount overlapping a light emitting portion of the VCSEL die configured to allow light emitted from the VCSEL die to escape from the VCSEL die package in an outward direction, according to some embodiments.

In some embodiments, components of the VCSEL die package form part of a thermally conductive pathway to transfer heat generated by the VCSEL die away from the VCSEL die. The thermally conductive pathway may transfer heat generated from the VCSEL die to a thermal dissipater (e.g. a heat sink or thermal pipe) that dissipates the transferred heat. The thermally conductive pathway may include the bottom electrode, the bottom substrate, a thermal pad coupling the VCSEL die package to the thermal dissipater, the thermal dissipater, or some combination thereof.

In some embodiments, a system for electrically coupling to a VCSEL die without wire bonding includes a VCSEL die, the VCSEL die package, and the thermally conductive pathway.

In some embodiments, a light source package is configured to emit light. The light source package includes a VCSEL die, a VCSEL die package, a thermally conductive pathway, and an optical coupling. The VCSEL die is configured to emit light. The VCSEL die package includes a bottom substrate and a submount. The bottom substrate includes a bottom contact pad configured to electrically couple to a bottom electrode on a bottom surface of the VCSEL die. The submount includes a submount contact pad configured to electrically couple to a first electrode on another surface of the VCSEL die. The submount contact pad overlaps with a portion of the first electrode, and the VCSEL die is positioned between the submount and the bottom substrate. The thermally conductive pathway includes a thermal pad and a thermal dissipater. The thermal pad couples the VCSEL die package to the thermal dissipater. The thermal pad and the VCSEL die package are configured to transfer heat from the VCSEL die to the thermal dissipater. The thermal dissipater is configured to dissipate heat transferred from the VCSEL die. The optical coupling is coupled to the VCSEL die package. The optical coupling is configured to direct light emitted from the VCSEL die through an aperture out of the light source package.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

A vertical cavity surface emitting laser (VCSEL) die package includes a bottom substrate and a submount for electrically coupling to a VCSEL die without using wire bonding, according to some embodiments. The VCSEL die includes a bottom electrode on a bottom surface of the VCSEL die and at least one electrode on another surface of the VCSEL die. A bottom contact pad on the bottom substrate electrically couples to the bottom electrode of the VCSEL die, and a submount contact pad on the submount electrically couples to the at least one electrode on another surface of the VCSEL die. According to some embodiments, the at least one electrode on another surface of the VCSEL die is a top electrode on a top surface of the VCSEL die.

The submount fits over the VCSEL die, covering at least a portion of the top surface of the VCSEL die with a light emitting portion of the VCSEL die exposed through an aperture in the submount. Opposite the submount, the bottom substrate covers at least a portion of the bottom surface of the VCSEL die. In some embodiments, the submount also covers at least a portion of side surfaces of the VCSEL die. The submount and the bottom substrate are discrete parts of the VCSEL die package that come together to sandwich a border portion of the VCSEL die where the submount, the VCSEL die, and the bottom substrate overlap. The submount and the bottom substrate form an enclosure containing the VCSEL die, according to some embodiments. Using the submount contact pad and the bottom contact pad of the VCSEL die package, electrical signals may be applied to the electrodes of the VCSEL die corresponding to one or more VCSELs of the VCSEL die. Light emitted from the one or more VCSELs may escape from the VCSEL die package in an outward direction through an aperture defined in the submount.

A conventional package for a vertical cavity surface emitting laser (VCSEL) die may electrically contact top electrodes on a top surface of the VCSEL die by wire bonding contact pads on the package to the top electrodes. In some cases, a bottom surface of the VCSEL die is adhered to a conventional package at the center of the package and electrodes of the VCSEL die on a top surface of the VCSEL die are wire bonded to adjacent wire bonding pads on the conventional package for electrical connection. The layout of a conventional package requires space for the wire bonding pads and space to accommodate the wire bonding. For example, the wire bonding pads may be spaced apart from each other to provide enough space for the wire bonding. Additionally, the conventional package includes space corresponding to a distance a wire bonding wire travels from each wire bonding pad to a corresponding top electrode of the VCSEL die. This results in an increased size of the conventional package which may be problematic for applications that have strict design requirements or call for a minimal form factor of the package.

Since the VCSEL die package, according to embodiments of the present disclosure, does not use wire bonding, the VCSEL die package may achieve a smaller form factor and size than a conventional package. As a result, the VCSEL die package is advantageous for applications that have design requirements necessitating a smaller form factor. Additionally, since wire bonding is not involved, the assembly process for the VCSEL die package, including electrically coupling to the VCSEL die, may be simplified and have a higher yield than assembly processes for conventional packages that involve wire bonding.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to create content in an artificial reality and/or are otherwise used in an artificial reality. The artificial reality system that provides the artificial reality content may be implemented on various platforms, including a wearable device (e.g., headset) connected to a host computer system, a standalone wearable device (e.g., headset), a mobile device or computing system, or any other hardware platform capable of providing artificial reality content to one or more viewers.

Figures 1A, 1B:
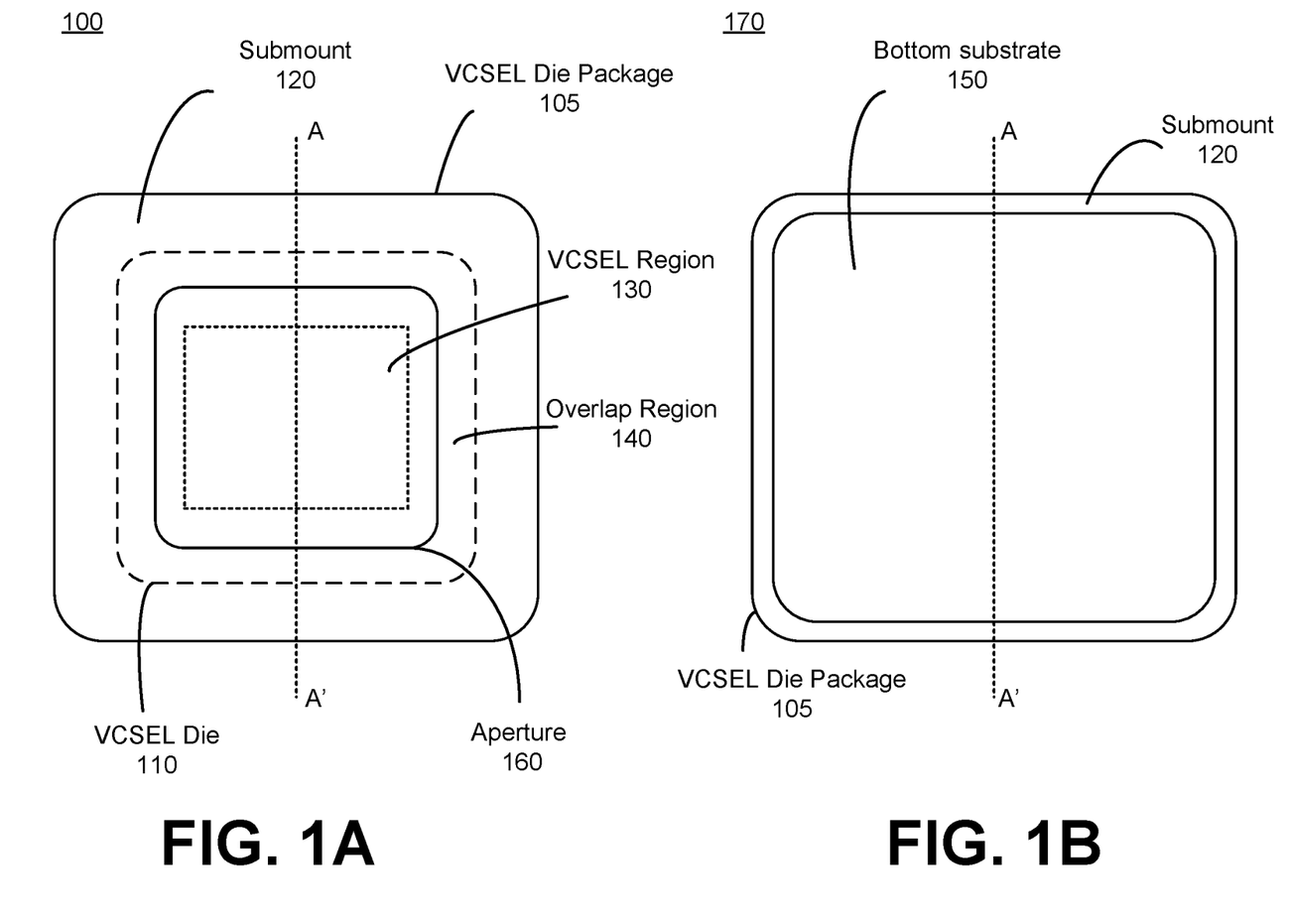
FIG. 1A shows a top view of a vertical cavity surface emitting laser (VCSEL) die package containing a VCSEL die, according to some embodiments.
FIG. 1B shows a bottom view of the VCSEL die package in FIG. 1A, according to some embodiments.

FIG. 1A shows a top view of a vertical cavity surface emitting laser (VCSEL) die package containing a VCSEL die, according to some embodiments. The top view 100 shows the VCSEL die package 105 including the contained VCSEL die 110 and the submount 120.

The VCSEL die 110 is a semiconductor die that includes one or more VCSELS in a VCSEL region 130 on a top surface of the VCSEL die 110. The one or more VCSELs are configured to emit laser light in response to receiving an electrical bias and/or signal. The emitted laser light may be in various wavelength bands. For example, the emitted laser light from the one or more VCSELs in the VCSEL region 130 may be in an infrared wavelength band, a visible light wavelength band, other wavelength bands, or some combination thereof.

In some embodiments, the VCSEL die 110 includes only a single VCSEL in the VCSEL region 130. The VCSEL die 110 includes an array of VCSELs in the VCSEL region 130, according to other embodiments. The array of VCSELs may have various arrangements and layouts in the VCSEL region 130. For example, the array of VCSELs may be arranged in a grid with corresponding rows and columns for each discrete VCSEL, according to some embodiments. In other embodiments, the array of VCSELs may be arranged in a linear pattern, a pseudo-random pattern, or another arrangement in the VCSEL region 130. In some embodiments, the VCSEL die 110 includes one or more groups of VCSELs. A group is one or more VCSELS that are electrically coupled togethers such that they function as a single unit (e.g., activating/deactivating the group activates/deactivates all the VCSELs within the group). Examples of the VCSEL die 110, according to various embodiments, are discussed further below with respect to FIGS. 3A and 3B.

The VCSEL die 110 includes one or more top electrodes on a top surface of the VCSEL die 110 in an overlap region 140. The overlap region 140 is a region where the top surface of the VCSEL die 110 overlaps with the submount 120. According to some embodiments, the top electrodes are electrically connected to the one or more VCSELs in the VCSEL region 130. The top electrodes may be anodes of the one or more VCSELs in the VCSEL region 130. The VCSEL die 110 may also include conductive traces (not shown) on the top surface of the VCSEL die 110. The conductive traces may electrically connect the one or more VCSELs to electrodes of the VCSEL die 110. The VCSEL die 110 may also include electrodes on the top surface of the VCSEL die 110 that are not within the overlap region 140. For example, the VCSEL die 110 may include electrodes within the VCSEL region 130.

The VCSEL 110 die includes a bottom electrode (shown in FIG. 2) on the bottom surface of the VCSEL die 110 opposite the top surface of the VCSEL die 110. In some embodiments, the bottom electrode is a cathode of the one or more VCSELs in the VCSEL region 130. In further embodiments, the bottom electrode is a common electrode for an array of VCSELs or an array of groups of VCSELs in the VCSEL region 130. In other embodiments, the VCSEL die includes a plurality of bottom electrodes on the bottom surface of the VCSEL die 110. In further embodiments, each bottom electrode may be a cathode of a VCSEL or a group of VCSELs in the VCSEL region 130. The VCSEL die 110 may also include other electrodes and conductive traces on the bottom surface of the VCSEL die 110. In some embodiments, the VCSEL die 110 includes electrodes on a side surface of the VCSEL die 110.

The VCSEL die package 105 is configured to electrically couple to the top electrodes in the overlap region 140 and bottom electrode of the VCSEL die 110 without wire bonding. The VCSEL die package 105 may be configured to electrically couple to the electrodes on the side surface of the VCSEL die 110 without wire bonding, according to further embodiments. In some embodiments, the VCSEL die package 105 may electrically couple to electrodes on all sides (bottom surface, top surface, and various side surfaces) of the VCSEL die 110.

The VCSEL die package 105 includes a submount 120 that covers a portion of a top surface of the VCSEL die 110 and a bottom substrate 150 (shown in FIG. 1B) that covers a bottom surface of the VCSEL die 110. According to some embodiments, the bottom substrate 150 and the submount 120 form an enclosure containing the VCSEL die 110. An outer edge of the VCSEL die 110 is shown by a dashed line in FIG. 1A. The VCSEL die 110 is underneath the submount in the overlap region 130, as shown in FIG. 1A.

The submount 120 covers at least a portion of the top surface of the VCSEL die 110 and is configured to electrically couple to one or more top electrodes of the VCSEL die 110 in the overlap region 140, according to some embodiments. The submount may comprise a copper material, an aluminum nitride material, an aluminum oxide material, some other material configured to cover a portion of the top surface of the VCSEL die 110, or some combination thereof. In some embodiments, the submount 120 electrically contacts an electrode on a side surface of the VCSEL die 110. The submount 120 partially surrounds the VCSEL die 110. In some embodiments, the submount 120 affixes the VCSEL die 110 to the bottom substrate 150.

The submount 120 includes submount contact pads (shown in FIG. 2) on a portion of an inner bottom surface of the submount in the overlap region 140. Each of the submount contact pads electrically couples to one of the top electrodes of the VCSEL die 110 in the overlap region 140. In some embodiments, each of the submount contact pads overlaps one of the top electrodes of the VCSEL die 110 in the overlap region 140.

The submount 120 may be a single monolithic structure, as shown in FIG. 1A. In other embodiments, the submount 120 may not be a single monolithic structure, but may be comprised of a plurality of discrete parts. For example, the submount 120 may be divided into a plurality of parts that are assembled to form the submount 120. According to further embodiments, each of the parts of the submount 120 may couple to one of the top electrodes of the VCSEL die in the overlap region 140. For example, in the case where the VCSEL die 110 includes an array of 4 VCSELs in the VCSEL region 130 with 4 corresponding top electrodes in the overlap region 130, the submount 120 may include 4 discrete parts, with each discrete part including a submount contact pad. Each part may electrically couple to one of the top electrodes with the respective submount contact pad.

An aperture 160 is defined in the submount overlapping a light emitting portion of the VCSEL die and configured to allow light emitted from the one or more VCSELs to escape from the VCSEL die package 105 in an outward direction. The light emitting portion corresponds to the VCSEL region 130, according to some embodiments. For example, in some embodiments, the aperture 160 exposes at least a portion of the VCSEL region 130. The light is emitted from the VCSEL die package 105 through the aperture 160 away from the bottom substrate 150. The aperture 160 is shown in FIG. 1A as having a shape corresponding to a rectangle, but the aperture 160 may have another shape, according to some embodiments. For example, the aperture 160 may have a shape corresponding to an oval or a circle. In alternate embodiments, a plurality of apertures 160 are defined in the submount 120, each aperture 160 overlapping a corresponding light emitting portion of the VCSEL die 110.

FIG. 1B shows a bottom view 170 of the VCSEL die package 105 in FIG. 1A, according to some embodiments. The bottom view 170 is opposite the top view 100 shown in FIG. 1A. The bottom view 170 shows the bottom substrate 150 and the submount 120. The bottom substrate 150 supports the VCSEL die 110 and electrically couples to a bottom electrode of the VCSEL die 110. The bottom substrate 150 may comprise a copper material, an aluminum nitride material, an aluminum oxide material, or some other material configured to support the VCSEL die 110 and cover at least a portion of the bottom substrate 150, or some combination thereof. In some embodiments, the bottom substrate 150 comprises a same material as the submount 150.

In some embodiments, a majority of a bottom surface of the VCSEL die 110 is coupled to the bottom substrate 150. The submount 120 and the bottom substrate 150 together form an enclosure containing the VCSEL die 110. In some embodiments, the submount 120 and the bottom substrate 150 sandwich the VCSEL die 110. In some embodiments, as shown in FIGS. 1A and 1B, the submount 120 and the bottom substrate 150 form a shell-like enclosure containing the VCSEL die 110. The bottom substrate 150 and the submount 120 may each include conductive traces and/or circuitry not shown in FIGS. 1A and 1B.

In some embodiments, the VCSEL die package 105 is a component of a headset (e.g., an augmented reality, virtual reality, or mixed reality headset). The VCSEL die package 105 may be incorporated into a depth camera assembly to provide laser illumination from the VCSEL die 110 onto a local area of the headset, according to some embodiments. In some embodiments, the VCSEL die package 105 is part of a structured light source for producing a structured light pattern. The VCSEL die package 105 including embodiments of the VCSEL die 110 may have an improved form factor over conventional packages that is advantageous for such applications that benefit from a smaller form factor and ease of assembly. In some embodiments, the VCSEL die package 105 is configured to contain and electrically contact a die or circuit other than a VCSEL die.

VCSEL Die Package

Figure 2:
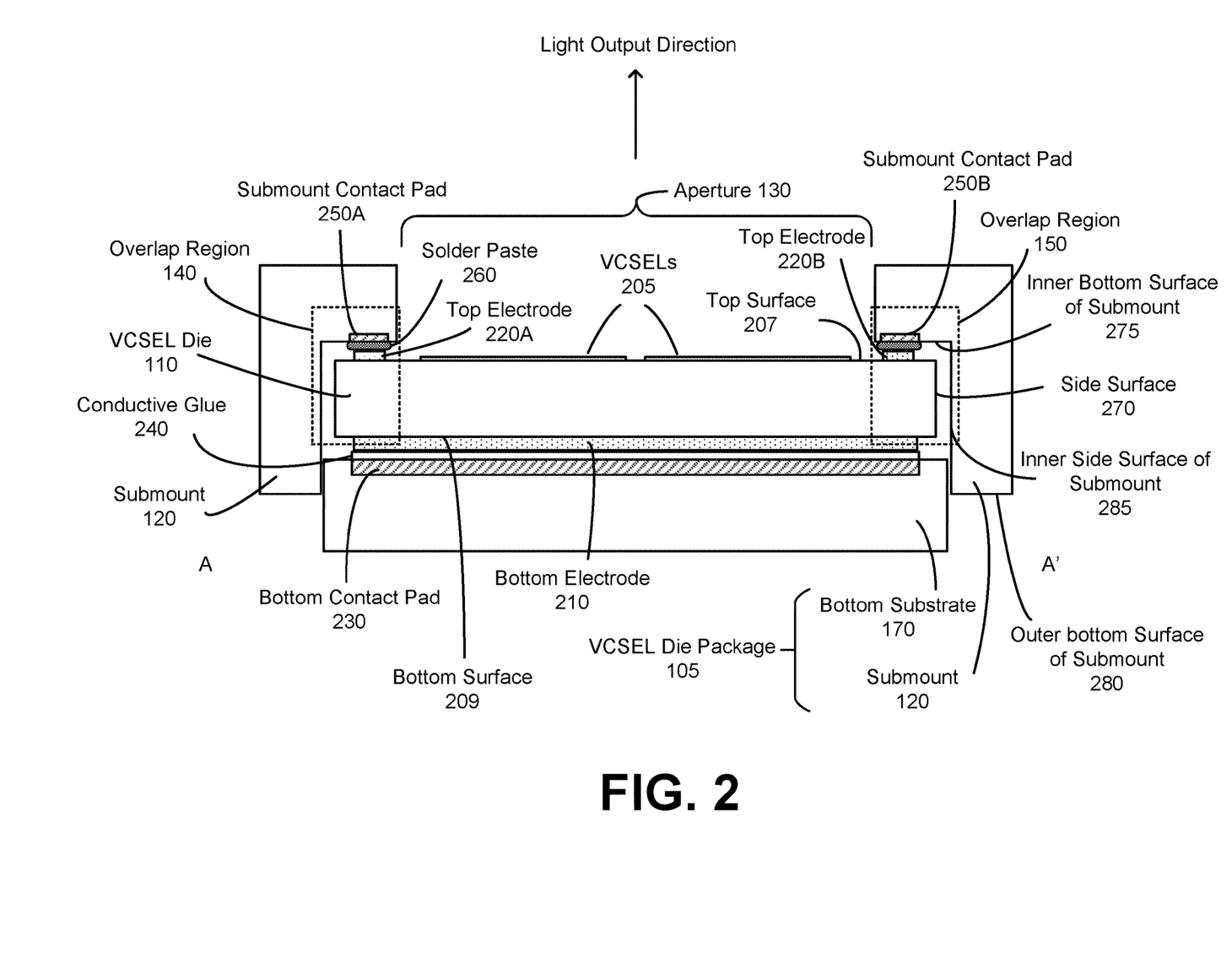
FIG. 2 shows a cross-section of the VCSEL die package in FIGS. 1A and 1B along the line A-A', according to some embodiments.

FIG. 2 shows a cross-section of the VCSEL die package 105 in FIGS. 1A and 1B along the line A-A', according to some embodiments.

The VCSEL die 110, according to some embodiments, includes the VCSELs 205 on the top surface 207 of the VCSEL die 110, a bottom electrode 210 on the bottom surface 209 of the VCSEL die 110, and a plurality of top electrodes (including the top electrodes 220A-220B) on the top surface 207 of the VCSEL die 210. The electrodes of the VCSEL die 110, including the bottom electrode 210 and the top electrodes 220A-220B, each comprise an electrically conductive material. In some embodiments, the bottom electrode 210 and the top electrodes 220A-220B may comprise a metal material, but they are not limited to metal materials. In some embodiments, the electrodes 220A-220B comprise a solder ball, a conductive glue, some other electrically conductive material, or some combination thereof. The VCSELs 205 are configured to emit laser light in the light output direction, in response to an electrical signal applied to the bottom electrode 210 and the top electrodes 220A-220B.

The VCSEL die 110 includes one or more side surfaces, including the side surface 270. In some embodiments, the VCSEL die 110 includes electrodes on the one or more side surfaces (e.g., the side surface 270) of the VCSEL die 110. In the embodiment shown in FIG. 2, each of the top electrodes 220A-220B is an anode of one or more of the VCSELs 205, and the bottom electrode is a common cathode of the VCSELs 205, with the bottom electrode 210 overlapping a majority of the bottom surface 209 of the VCSEL die 110. Each of the top electrodes 220A-220B (or the bottom electrode 210 according to some embodiments) may be an anode pad which is a portion of an anode configured to make electrical contact to the submount 120. In other embodiments, the top electrodes 220A-220B are cathodes, and the bottom electrodes 210 are anodes. Although the VCSEL die 105 is shown in FIG. 2 with a single bottom electrode 210 and two top electrode 210, the VCSEL die 105 may include a different number and/or arrangement of top electrodes and bottom electrodes. For example, the VCSEL die 110 may include a plurality of bottom electrodes 210 on the bottom surface of the VCSEL die 210.

In some embodiments, the VCSEL die 110 includes both anodes and cathodes of the VCSELs 205 on one surface (e.g., the top surface 207 or the bottom surface 209) of the VCSEL die 110. For example, the VCSEL die 110 may include both anodes and cathodes of the VCSELs 205 in the form of top electrodes (e.g. top electrodes 220A and 220B) on the top surface 207 of the VCSEL die 110 in the overlap region 140. In other examples, the VCSEL die 110 may include a plurality of bottom electrodes, including both anodes and cathodes of the VCSELs 205 on the bottom surface 209 of the VCSEL die 110. In further embodiments, the VCSEL die 110 includes anodes and cathodes of the VCSELs 205 only on the top surface 207 of the VCSEL die 110 in the overlap region 140. In alternate embodiments, the VCSEL die 110 includes anodes and cathodes of the VCSELs 205 only on the bottom surface 209 of the VCSEL die 110.

The VCSEL die package 105, as shown in FIG. 2, includes the bottom substrate 150 and the submount 120, according to some embodiments. The bottom substrate 150 includes a bottom contact pad 230 for electrically coupling to the bottom electrode 210 of the VCSEL die 110. The bottom contact pad 230 comprises an electrically conductive material (e.g., a metal). The bottom contact pad 230 is on a top surface of the bottom substrate 150 facing the bottom surface 209 of the VCSEL die 110. In the embodiment shown in FIG. 2, the bottom contact pad 230 completely overlaps with the bottom electrode 210. In other embodiments, the bottom contact pad 230 may overlap with a portion of the bottom electrode 210.

According to some embodiments, the bottom contact pad 230 may be connected to conductive traces (not shown) of the bottom substrate 150. The conductive traces may electrically connect the bottom contact pad 230 to components or electrodes external to the VCSEL die package 105. In other embodiments, the bottom substrate 150 is formed of an electrically conductive material, and the bottom contact pad 230 corresponds to a portion of or the entirety of the bottom substrate 150.

As shown in FIG. 2, the bottom electrode 210 of the VCSEL die 110 is connected to the bottom contact pad 230 using a conductive glue 240, according to some embodiments. In other embodiments, the bottom contact pad 230 is connected to the bottom electrode 210 using other methods. In some embodiments, the bottom substrate 150 includes a plurality of bottom contact pads 210 on the top surface of the bottom substrate 150 configured to connect to one or more bottom electrodes 210 on the bottom surface 209 of the VCSEL die 110. According to some embodiments, an array of bottom contact pads 230 on the top surface of the bottom substrate 150 may correspond to an array of bottom electrodes 210 on the bottom surface 209 of the VCSEL die 110. Each bottom contact pad 230 of the array may be connected to a bottom electrode 210 using a conductive glue 240.

In some embodiments, the bottom electrode 210, the bottom contact pad 230, and the bottom substrate 150 form a thermally conductive pathway for heat to escape from the VCSEL die 110. In further embodiments, the bottom substrate 150 may be thermally coupled to a heat sink and/or thermal dissipater for dissipating heat that is generated in the VCSEL die 110, as discussed below with respect to FIG. 4.

The submount 120 covers at least a portion of a top surface 207 of the VCSEL die 110 opposite the bottom surface and electrically couples to the top electrodes 220A-220B in the overlap region 140. The submount 120 overlaps a portion of the bottom substrate 150, according to some embodiments. The submount 120 may further cover one or more side surfaces of the VCSEL die 110, with the bottom substrate 150 and the submount 120 together forming an enclosure containing the VCSEL die 110.

In some embodiments, the submount 120 has an outer shape approximately corresponding to an annulus. In other embodiments, the submount 120 has an outer shape approximately corresponding to a rectangular prism with a clear aperture in the center. The submount 120 may have another outer shape, according to some embodiments. A recess is defined in the submount 120 corresponding to the VCSEL die 110, according to some embodiments. In this case, a bottom surface of the submount 120 includes an inner bottom surface 275 and an outer bottom surface 280 below the inner bottom surface 275, with the VCSEL die 110 positioned inside the recess of the submount overlapping the inner bottom surface 275. In some embodiments, the submount and the bottom substrate are configured to form a shell containing the VCSEL die 110. Although the VCSEL die 110 is shown positioned in the center of the VCSEL die package 105, in other embodiments, the VCSEL die 110 is positioned in another location.

The submount 120 includes the aperture 160 defined in the submount 120 and a plurality of submount contact pads (including the submount contact pads 250A-250B). The aperture 160 overlaps with and exposes a light emitting area of the VCSEL die 110. The aperture 160 overlaps the VCSELs 205, allowing light emitted from the VCSELs 205 to escape from the VCSEL die package 105 in the light output direction. In other embodiments, more than one aperture 160 is defined in the submount 120. For example, a plurality of apertures 160 may be defined in the submount 120, each aperture corresponding to and overlapping with one or more VCSELs 205. In further embodiments, a corresponding aperture 160 is defined for each of the VCSELs 205 of the VCSEL die 110.

The submount 120 includes at least one submount contact pad on the inner bottom surface 275 of the submount 120 in the overlap region 140. In the embodiment shown in FIG. 2, the submount contact pads 250A-250B are positioned on the inner bottom surface 275 of the submount 120. The submount contact pads 250A-250B comprise an electrically conductive material (e.g., a metal). Each of the submount contact pads 250A-250B are configured to overlap with a portion of a corresponding top electrode (e.g., top electrodes 220A-220B) of the VCSEL die 110, as shown in FIG. 2. In the example shown in FIG. 2, the submount contact pad 250B is positioned on the inner bottom surface 275 of the submount 120 that faces the top surface 207 of the VCSEL die 110. The submount contact pad 250A is connected to the top electrode 220A, and the submount contact pad 250B is connected to the top electrode 220B using a solder paste (e.g., solder paste 260), according to some embodiments. In other embodiments, the submount contact pads 250A-250B are electrically connected to the corresponding top electrodes 220A-220B by other methods. The submount contact pads 250A-250B may be further electrically coupled to conductive traces (not shown) of the submount 120. For example, conductive traces on the submount 120 may electrically couple the submount contact pads 250A-250B to components and/or electrodes external to the VCSEL die package 105.

In some embodiments, the submount 120 includes submount contact pads on a surface of the submount 120 other than the bottom surface of the submount 120. For example, in some embodiments, a submount contact pad 250 may be positioned on an inner side surface 285 of the submount 120 facing a side surface of the VCSEL die 110. The submount contact pad on the inner side surface 285 of the submount 120 electrically couples to an electrode on the side surface of the VCSEL die 110, according to some embodiments. Using the submount contact pads and the bottom contact pad 230, the VCSEL die package 105 may form electrical contacts with electrodes on all surfaces of the VCSEL die 110, some of which may not be easily coupled to using conventional wire bonding or die bonding techniques.

Since the VCSEL die package 105 does not include pads with a spacing and arrangement for wire bonding, the VCSEL die package 105 may have smaller lateral dimensions (e.g., width and/or length) than a conventional package that uses wire bonding. In some embodiments, a width and/or a length of the VCSEL die package 105 may be smaller than a width and/or a length of a conventional package that uses wire bonding by 2 mm or greater. Thus, the VCSEL die package 105 may have a reduced form factor, in comparison to conventional packages. In particular, the lateral dimensions of the VCSEL die package 105 may be smaller than those of a conventional package. The reduced form factor may be advantageous for application such as for use in a virtual reality, augmented reality, or mixed reality headset. Additionally, since the VCSEL die package 105 does not use wire bonding, the yield of assembling the VCSEL die package 105 with the VCSEL die 110 and successfully electrically coupling to the electrodes of the VCSEL die 110 may be improved over the yield of methods using conventional packages. According to some embodiments, assembly of the VCSEL die package 105 with the VCSEL die 110 may also be less expensive and/or time consuming than for conventional packages, since wire bonding is not involved. A method for assembling the VCSEL die package 105 with the VCSEL die 110 is discussed further below, with respect to FIG. 5.

Embodiments of the VCSEL die package 105 and the VCSEL die 110 may have a different configuration than shown in FIG. 2. For example, the VCSEL die package 105 may have a different position and number of the submount pads than is shown in FIG. 2. In other examples, the recess and the aperture 160 of the VCSEL die package 105 may have a different shape and configuration. In some embodiments, the VCSEL die package 105 may contain more than one VCSEL die 105. In such cases, the submount 120 may include a separate aperture for each VCSEL die 105 contained by the VCSEL die package 105.

Example VCSEL Dies

Figures 3A, 3B:
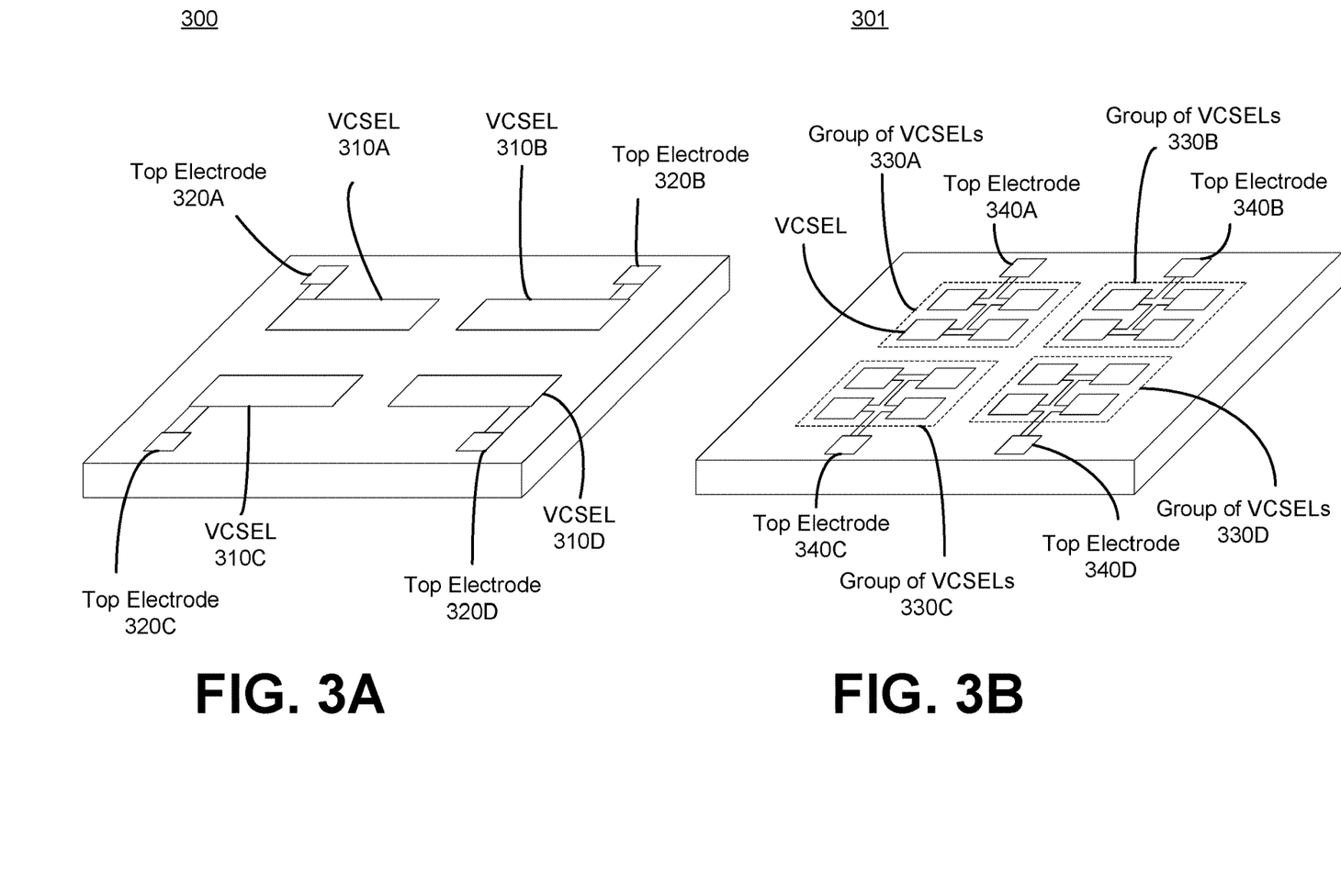
FIG. 3A shows an example VCSEL die including an array of four VCSELs, according to some embodiments.
FIG. 3B shows an example VCSEL die including an array of four groups of VCSELs, according to some embodiments.

FIG. 3A is an example VCSEL die 300 including an array of four VCSELs 310A-310D, according to some embodiments. The VCSEL die 300 is an embodiment of VCSEL die 110 shown in FIGS. 1A and 2 that includes a plurality of discrete VCSELs 310A-310D and a plurality of top electrodes 320A-320D on a top surface of the VCSEL die 300. Each top electrode 320A-320D is electrically connected to a corresponding discrete VCSEL 310A-310D. For example, the top electrode 320A is electrically connected to VCSEL 310A for addressing VCSEL 310A. The VCSEL die 300 may include a different configuration and number of components than shown in FIG. 3A, for example a different number of VCSELs, a different number of top electrodes, and/or a different arrangement of the VCSELs and top electrodes, according to some embodiments.

FIG. 3B is an example VCSEL die 301 including an array of four groups of VCSELs 330A-330D, according to some embodiments. The VCSEL die 301 is an embodiment of the VCSEL die 110 shown in FIGS. 1A and 2 that includes a plurality of groups of VCSELs 330A-330D. Each top electrode 340A-340D is commonly electrically coupled to the discrete VCSELs of a corresponding group of VCSELs 330A-330D. For example, the top electrode 340A is electrically coupled to the 4 discrete VCSELS of the group of VCSELs 330A.

The VCSEL die package 105 containing the VCSEL die 301 may include a plurality of submount contact pads. According to some embodiments, each of the plurality of submount contact pads may couple to one of the plurality of top electrodes 340A-340D. For example, the VCSEL die package 105 may include 4 submount contact pads, each corresponding to one of the top electrodes 340A-340D and addressing a corresponding one of the groups of VCSELs 330A-330D. The VCSEL die 301 may include a different configuration and number of components than shown in FIG. 3B, for example a different number of VCSELs per group of VCSELs a different number of groups of VCSELs, a different number of top electrodes, and/or a different arrangement of the groups of VCSELs and top electrodes, according to some embodiments.

The VCSEL die 300 and the VCSEL die 301 each include the bottom electrode 210 (as shown in FIG. 2). The bottom electrode 210 is connected to one or more VCSELs of the respective VCSEL die. In some embodiments, the bottom electrode 210 is commonly connected to all of the discrete VCSELs of the respective VCSEL die. In other embodiments, the respective VCSEL die includes a plurality of bottom electrodes on the bottom surface of the respective VCSEL die. Each of the plurality of bottom electrodes may be electrically connected to an individual discrete VCSEL of the respective VCSEL die. In some embodiments, each of the plurality of bottom electrodes is electrically connected to a group of discrete VCSELs. A respective VCSEL die may also include one or more bottom electrodes connected to components on the respective VCSEL die other than a VCSEL, according to some embodiments.

Thermally Conductive VCSEL Die Package

Figure 4:
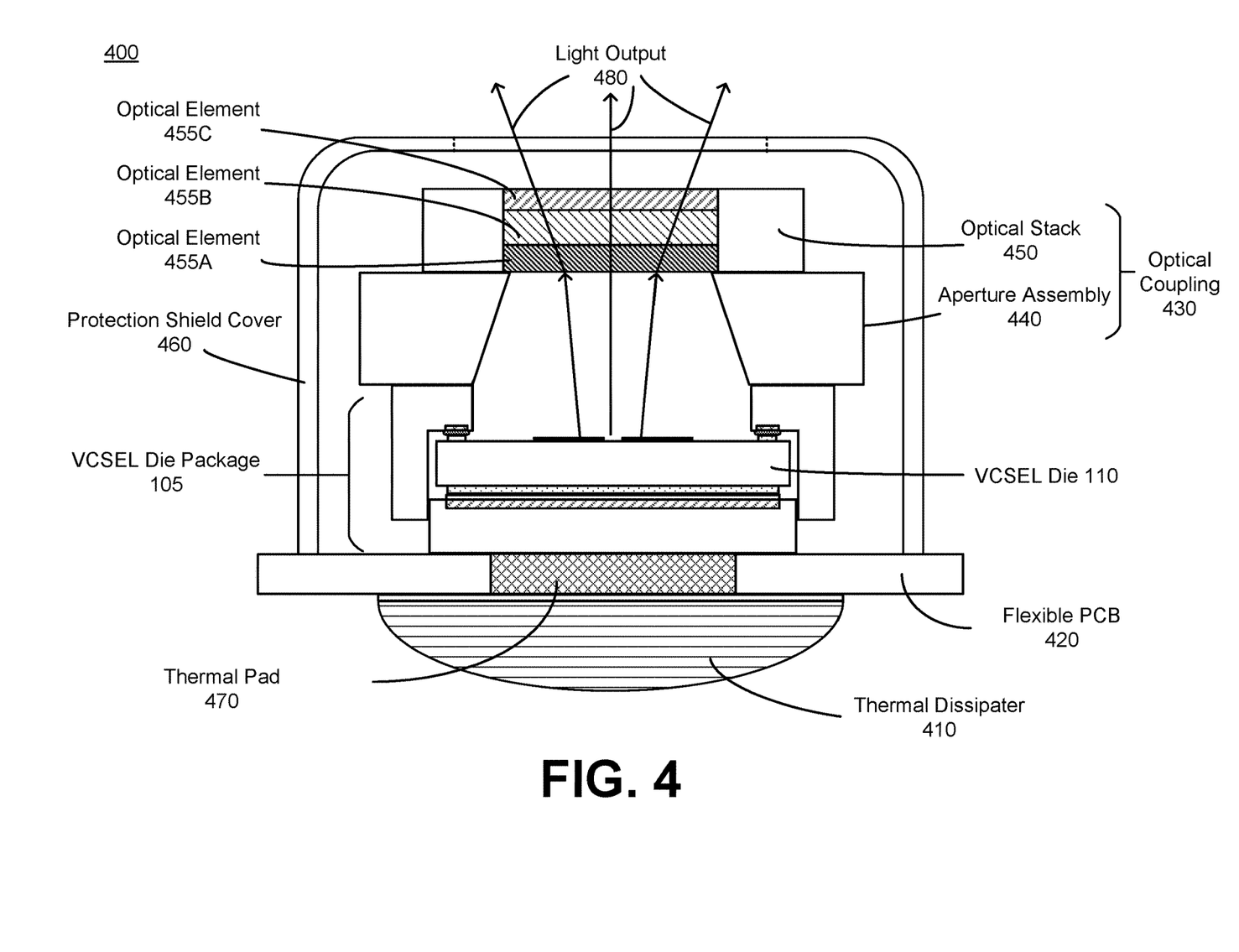
FIG. 4 shows a cross-section of a thermally conductive package, including a VCSEL die package, according to some embodiments.

FIG. 4 shows a cross-section of a light source package 400, including the VCSEL die package 105, according to some embodiments. The light source package 400 includes a thermally conductive pathway configured to transfer heat generated by the VCSEL 110 to a thermal dissipater 410. Components of the light source package 400 thermally couple to the VCSEL die package 105, forming a thermally conductive pathway from the VCSEL die 110 to the thermal dissipater 410. The light source package 400 includes a VCSEL die package 105 containing the VCSEL die 110, the thermal dissipater 410, a flexible printed circuit board (PCB) 420, an optical coupling 430, protection shield cover 460, and a thermal pad 470, according to some embodiments.

The VCSEL die package 105 has a similar structure and configuration as the VCSEL die package 105 (bottom substrate, bottom contact pad, submount, submount pad, etc.) shown in FIG. 2, according to some embodiments. One or more of the bottom electrodes of the VCSEL die 110 (e.g., the cathode), the bottom contact pad of the VCSEL die package 105 connected to the one or more of the bottom electrodes, the bottom substrate of the VCSEL die package 105, or some combination thereof are thermally conducting. The VCSEL die package 105 contains the VCSEL die 110, which emits light in an upward direction towards the optical coupling 430 through the aperture in the submount of the VCSEL die package 105.

The optical coupling 430 conditions light that is emitted from the VCSEL die 105 using various optical components and includes the aperture assembly 440 and the optical stack 450, according to some embodiments. For example, the optical coupling 430 may direct the light emitted from the VCSEL die 105. The optical coupling 430 is coupled to the aperture of the VCSEL die package 105. In the embodiment shown in FIG. 4, the optical coupling 430 includes an aperture assembly 440 and an optical stack 450.

The aperture assembly 440 is a housing that couples to the optical stack 450 and the VCSEL die package 105. The aperture assembly 440 may comprise a metal material, a plastic material, a liquid crystal polymer material, a polycarbonate material, some other material configured to couple the optical stack 450 to the VCSEL die package 105, or some combination thereof. The aperture assembly 440 directs light from the VCSEL die 110 to the optical stack 450 and positions the optical stack 450 at an appropriate distance from the VCSEL die 110. For example, the aperture assembly 440 may position the VCSEL die 110 at a distance corresponding to an effective focal of the optical stack 450. In other embodiments, the projector housing may include additional optical components not shown in FIG. 4. The additional optical components may alter the light emitted from the VCSEL die 110 before reaching the optical stack 450.

The optical stack 450 optically adjusts light from the VCSEL die 110. The optical stack 450 includes one or more optical elements that are configured to optically adjust the light. Optical adjustment may include, collimating, diverging, converging, generate a structured light pattern, focusing, expanding, filtering, some other adjustment of light from the VCSEL die 110, or some combination thereof. An optical element may be, e.g., a lens (e.g., spherical, aspherical, freeform, cylindrical, etc.), a Fresnel lens, a diffractive optical element (e.g., a grating), an aperture, a filter, etc. For example, in the illustrated embodiment, the one or more optical elements include optical elements 455A, 455B, 455C. In some embodiments, each of the optical elements 455A-455C is a diffractive optical element (DOE), and the DOEs (optical elements 455A-455C) diffract the light from the individual VCSELs forming a structured light pattern (e.g., 2-D array of dots). Although FIG. 4 shows the optical stack including 3 optical elements 455A-455C, the optical stack 450 may include a different number and/or arrangement of optical elements.

In some embodiments, the optical coupling 430 includes more than one optical stack 450. In cases where the VCSEL die 110 includes an array of VCSELs, the optical coupling 430 may include a separate optical stack 450 for each VCSEL of the array. In embodiments where the VCSEL die 110 includes a plurality of groups of VCSELs, the optical coupling 430 may include a separate optical stack 450 for each group of VCSELs.

The protection shield cover 460 covers the VCSEL die package 105 and the optical coupling 430, according to some embodiments. The protection shield cover 460 protects the components of the VCSEL die package 105 and the optical coupling 430 from external factors, such as dust or damage. The protection shield cover 460 may be, e.g., a metal, a plastic, a polycarbonate (PC)/poly(methyl methacrylate) (PMMA) material, some other material that protects the VCSEL die package 105, or some combination thereof. The protection shield cover 460 includes an aperture for the light output 480 to exit. The aperture may include a window in some embodiments. The window may comprise a PC/PMMA material, a polycarbonate material, some other material that is transparent at wavelengths of light emitted from the VCSEL die 110, or some combination thereof. The window is transparent to light emitted from the VCSEL die package 105. For example, if the VCSEL die package 105 emits light in the near infrared, the window would be transparent to at least the near-infrared (e.g., could be fabricated from sapphire, UV fused silica, etc.) The light from the optical stack 450 passes through the aperture of the protection shield cover 460 and outwards from the light source package 400.

According to some embodiments, the VCSEL die package 105, the thermal pad 470, and the thermal dissipater 410 form a thermally conductive pathway for heat generated by the VCSEL die 110 to be transferred away from the VCSEL die 110 and dissipated by the thermal dissipater 410. Components of the VCSEL die package 105 (e.g., the bottom contact pads) of thermally couple the VCSEL die 110 to the other components of the thermally conductive pathway in the light source package 400. In this embodiment, the bottom electrodes of the VCSEL die 110, the bottom contact pad of the VCSEL die package 105, and the thermal pad 470 each comprise a thermally conductive material, according to some embodiments. In such a case, the bottom contact pad of the VCSEL die package 105 may extend downward and thermally couple to the thermal pad 470, coupling the bottom substrate to the thermal dissipater 410. In other embodiments, the bottom substrate of the VCSEL die package 105 also comprises a thermally conductive material. In such cases, the bottom contact pad of the VCSEL die package 105 may not necessarily extend downward and thermally couple to the thermal pad 470, with the thermal pad 470 directly coupling the bottom substrate to the thermal dissipater 410. In some embodiments, the submount contact pads of the VCSEL die package 105 connected to electrodes of the VCSEL die 110 and the submount of the VCSEL die package 105 are also thermally conductive and are a part of the thermally conductive pathway. In some embodiments, the bottom contact pad and the submount contact pads of the VCSEL die package 105 configured to form a thermally conductive pathway have larger surface areas than those of other embodiments of the VCSEL die package 105 that are not configured to form a thermally conductive pathway or couple to a thermal dissipater.

The thermal dissipater 410 is coupled to the bottom substrate of the VCSEL die package 105 and configured to dissipate the heat transferred from the VCSEL die 105. For example, the thermal dissipater 410 may be a heat sink, a thermoelectric cooler, a thermal pipe, or some combination thereof, according to some embodiments. The thermal dissipater 410 may comprise an aluminum material, some other material configured to dissipate heat, or some combination thereof. In some embodiments, the thermal dissipater 410 is a heat sink including thermal fins for dissipating the transferred heat. In other embodiments, the thermal dissipater 410 dissipates heat through various other methods.

The thermal pad 470 is a thermally conductive coupling that connects the bottom substrate and/or the bottom contact pad of the VCSEL die package 105 to the thermal dissipater 410. For example, the thermal pad 470 may be a mechanical coupling that comprises a thermally conductive material (e.g., a thermally conductive metal). In some embodiments, the thermal pad 470 may have a shape and/or configuration different than is shown in FIG. 4. For example, according to some embodiments, the thermal pad 470 may contact an entirety of a bottom surface of the bottom substrate of the VCSEL die package 105. In this case, since the thermal pad 470 contacts the entirety of the bottom surface of the bottom substrate of the VCSEL die 110, the flexible PCB 420 may not easily electrically couple to electrodes of the bottom substrate of the VCSEL die 110. Therefore, in further embodiments, the VCSEL die 110 includes anodes and cathodes of the one or more VCSELs on only the top surface of the VCSEL die 110, in the form of top electrodes in the overlap region (e.g., the periphery of the top surface of the VCSEL die 110) for electrical coupling to the submount of the VCSEL die package 105. The flexible PCB 420 may then electrically couple to the submount of the VCSEL die package 105 to electrically couple the anodes and cathodes on the top surface of the VCSEL die 110 to circuitry and components of the flexible PCB 420.

In some embodiments, each component of the thermally conductive pathway is formed from one or more thermally conductive materials (e.g. a material having a higher thermal conductivity than other components of the light source package 400). For example, components of the thermally conductive pathway may comprise a material having a thermal conductivity of approximately 400 W/m-K. The thermally conductive pathway of the thermally conductive package may provide improved thermal characteristics and thermal management of the VCSEL die 105.

The flexible PCB 430 couples to at least one of the bottom substrate or the submount of the VCSEL die package 105 and includes a circuit for addressing the submount contact pads and the bottom contact pads of the VCSEL die package 105, according to some embodiments. The circuit on the flexible PCB 430 may electrically connect to one or more electrodes and conductive traces of the VCSEL die package 105, including the bottom contact pad and the submount contact pad. In some embodiments, the flexible PCB 430 electrically connects at least one of the bottom contact pad or the submount contact pad to the circuit on the flexible PCB 430. The circuit on the flexible PCB 430 may be used to address the electrodes of the VCSEL die 110. For example, the VCSEL die package 105 may include conductive traces and/or electrical contacts on a bottom exterior surface of the bottom substrate that are electrically connected to a circuit on the flexible PCB 430. In further embodiments, the electrodes on the VCSEL die 110 are connected to the circuit on the flexible PCB 430 via the VCSEL die package 105.

The thermal dissipater 410 is coupled to the flexible PCB 430 on an opposite side of the flexible PCB 430 from the VCSEL die package 105. The flexible PCB 430 may be attached to the thermal dissipater 410 using thermally conductive adhesive, according to some embodiments. The flexible PCB 430 may have an opening where the thermal pad 470 extends from the thermal dissipater 410 to the VCSEL die package 105, as shown in FIG. 4. According to some embodiments, the VCSEL die package 105 may electrically connect components and/or electrodes of the VCSEL die 110 to components and/or electrodes of the flexible PCB 430.

In some embodiments, the light source package 400 includes other components and configurations than shown in FIG. 4. For example, in some embodiments, the light source package 400 only includes the VCSEL die package 105, the flexible PCB 420, the thermal pad 470, and the thermal dissipater 410. In other embodiments, the light source package 400 includes a different combination and/or configuration of the components.

Coupling the bottom electrode of the VCSEL die 110 with the VCSEL die package 105 enables a straightforward method for forming an efficient thermally conductive pathway from the VCSEL die 110 to the thermal dissipater 410, without requiring a complicated design or increasing the form factor in the VCSEL die package 105. The thermally conductive pathway and thermal dissipater 410 of the light source package 400 are advantageous, since the VCSEL die 110 may generate a considerable amount of heat during operation. For example, the VCSEL die may generate substantially more heat than a die including a camera sensor. In some embodiments, the VCSEL die may generate heat at a rate of 1 W or greater during operation. Improved thermal management as a result of the light source package 400 may improve the operation of the VCSEL die, while maintaining a simple and compact form factor for the VCSL die package 105.

Electrically Coupling to the VCSEL Die

Figure 5:
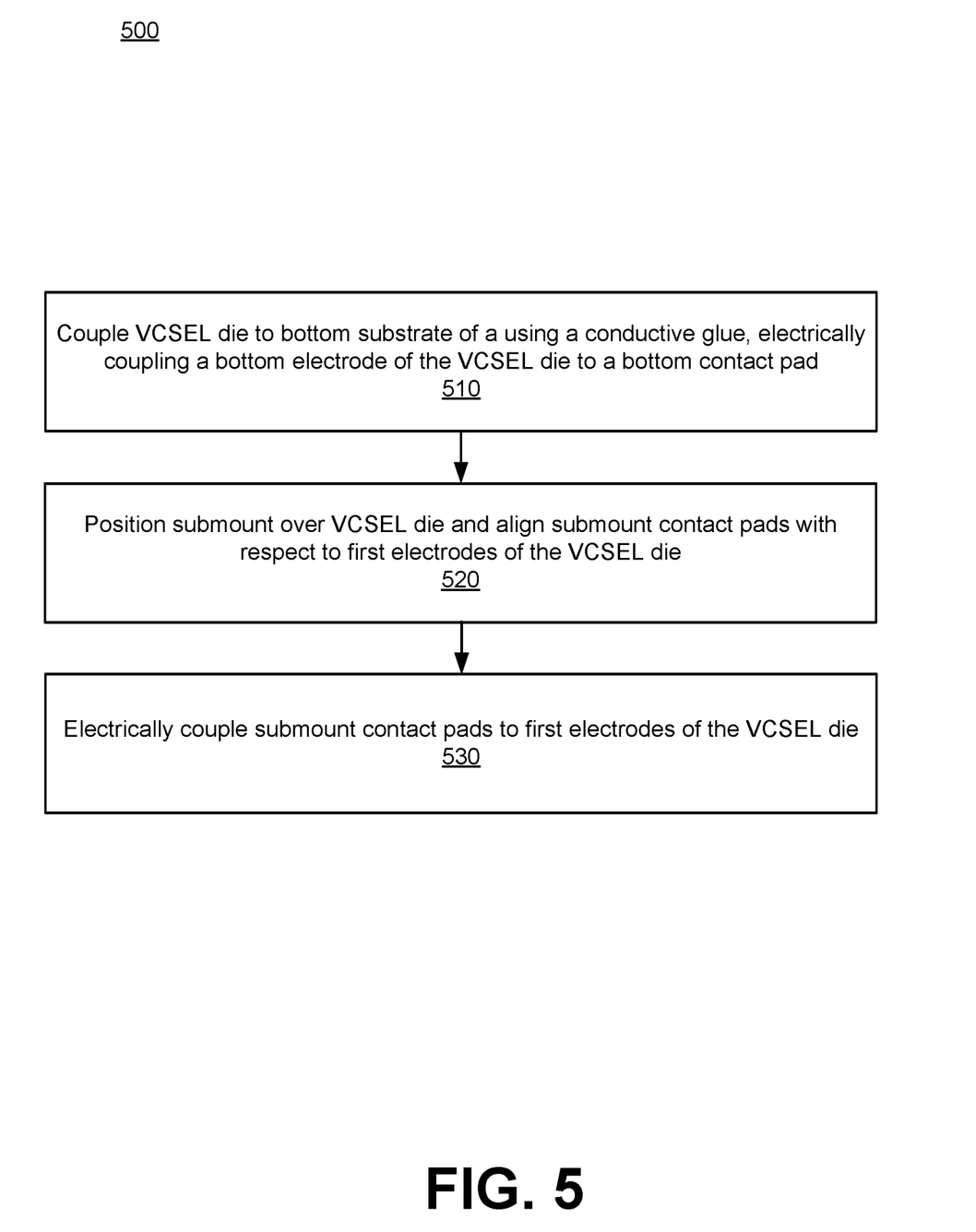
FIG. 5 is a flow chart of a method for electrically coupling to a VCSEL die using a VCSEL die package, according to some embodiments.

FIG. 5 is a flow chart of a method 500 for electrically coupling to a VCSEL die 110 using a VCSEL die package 105, according to some embodiments. The process shown in FIG. 5 may be performed by an assembly system for assembling VCSEL die packages. In some embodiments, the assembly system includes a die holder configured to hold the VCSEL die, a positioning assembly for positioning the bottom substrate and the submount, a coupling system for electrically coupling the contact pads of the VCSEL die package to the VCSEL die, and a controller (including one or more processors) for instructing the components of the assembly system. Other entities may perform some or all of the steps in FIG. 5 in other embodiments. Embodiments may include different and/or additional steps, or perform the steps in different orders.

The assembly system couples 510 a VCSEL die to a bottom substrate of a VCSEL die package using the die holder and the positioning assembly. The assembly system simultaneously electrically coupling a bottom electrode of the VCSEL die to a bottom contact pad of the bottom substrate with the coupling system. In some embodiments, the coupling system uses a conductive glue to couple the bottom contact pad to the bottom electrode. In some embodiments, the coupling of the bottom electrode to the bottom contact pad includes further treatment. For example, heat may be applied to the conductive glue to form an electrical contact between the bottom contact pad and the bottom electrode.

The assembly system positions 520 the submount over the VCSEL die and the submount pads are aligned with respect to the first electrodes of the VCSEL die, using the positioning assembly. The first electrodes are on another surface of the VCSEL die, e.g. the top surface opposite the bottom surface. The submount pads and/or the first electrodes may be treated with solder paste before and/or after positioning 520 the submount.

The assembly system electrically couples 530 the submount pads to the first electrodes using the coupling system, electrically coupling the submount pads to the respective first electrodes. The electrical coupling 530 may include applying heat to solder paste between the submount pads to form electrical contacts. The soldering 530 may also be performed by various other methods. In some embodiments, the submount is also connected to and/or adhered to the bottom substrate. For example, electrodes and/or conductive traces on the submount may be electrically coupled to electrodes and/or conductive traces of the bottom substrate.

Additional Considerations

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A vertical cavity surface emitting laser (VCSEL) die package comprising:
   a bottom substrate comprising a bottom contact pad electrically coupled to a bottom electrode on a bottom surface of a VCSEL die;
   a submount comprising a submount contact pad electrically coupled to a first electrode on another surface of the VCSEL die, the submount contact pad overlapping a portion of the first electrode and
   a thermal dissipater coupled to the bottom substrate and configured to dissipate heat from the VCSEL die,
   wherein the VCSEL die is positioned between the submount and the bottom substrate and the bottom substrate is a part of a thermally conductive pathway that transfers heat from the VCSEL die to the thermal dissipater.

2. The VCSEL die package of claim 1, further comprising a thermal pad coupling the bottom substrate to the thermal dissipater, the thermal pad a part of the thermally conductive pathway.

3. The VCSEL die package of claim 1, wherein the other surface of the VCSEL die is a top surface of the VCSEL die opposite the bottom surface.

4. The VCSEL die package of claim 3, wherein at least a part of the submount overlaps the top surface of the VCSEL die.

5. The VCSEL die package of claim 3, wherein the submount contact pad is on a bottom surface of the submount facing the top surface of the VCSEL die.

6. The VCSEL die package of claim 1, wherein a recess is defined in the submount, a bottom surface of the submount comprises an inner bottom surface and an outer bottom surface below the inner bottom surface, and the VCSEL die is positioned in the recess overlapping the inner bottom surface.

7. The VCSEL die package of claim 6, wherein the submount contact pad is on the inner bottom surface of the submount and the submount contact pad faces a top surface VCSEL die.

8. The VCSEL die package of claim 1, wherein an aperture is defined in the submount, the aperture overlapping a light-emitting portion of the VCSEL die and configured to allow emitted light from the VCSEL die to escape in an outward direction.

9. The VCSEL die package of claim 1, further comprising a flexible printed circuit board (PCB) coupled to at least one of the bottom substrate or the submount, wherein at least one of the bottom contact pad or the submount contact pad is coupled to a circuit on the flexible PCB.

10. The VCSEL die package of claim 1, further comprising an optical coupling coupled to at least one of the submount or the bottom substrate, the optical coupling configured to optically adjust light emitted from the VCSEL die.

11. The VCSEL die package of claim 1, wherein the VCSEL die comprises a plurality of discrete VCSELs.

12. The VCSEL die package of claim 11, wherein the first electrode comprises a plurality of first electrodes, each of the plurality of first electrodes is electrically connected to a corresponding one of the plurality of discrete VCSELs, the submount contact pad comprises a plurality of submount contact pads, and each of the plurality of submount contact pads electrically couples to one of the plurality of first electrodes.

13. The VCSEL die package of claim 11, wherein the bottom electrode is electrically coupled to each of the plurality of discrete VCSELs.

14. The VCSEL die package of claim 11, wherein the first electrode is electrically coupled to a group of discrete VCSELs of the plurality of discrete VCSELS.

15. The VCSEL die package of claim 1, wherein an entire bottom surface of the VCSEL die is coupled with the bottom substrate, and the submount covers at least a portion of a top surface of the VCSEL die opposite the bottom surface and affixes the VCSEL die to the bottom substrate.

16. The VCSEL die package of claim 15, wherein the submount further covers one or more side surfaces of the VCSEL die, and the bottom substrate and the submount together form an enclosure containing the VCSEL die.

17. The VCSEL die package of claim 1, wherein the bottom contact pad completely overlaps with the bottom electrode.

18. The VCSEL die package of claim 1, wherein the bottom contact pad comprises a plurality of bottom contact pads, the bottom electrode comprises a plurality of bottom electrodes, and each of the plurality of bottom contact pads electrically couples to one of the plurality of bottom electrodes.

19. A light source package comprising:
  a vertical cavity surface mitting laser (VCSEL) die configured to emit light;
  a VCSEL die package comprising:
    a bottom substrate comprising a bottom contact pad configured to electrically couple to a bottom electrode on a bottom surface of the VCSEL die, and
    a submount comprising a submount contact pad configured to electrically couple to a first electrode on another surface of the VCSEL die, the submount contact pad overlapping a portion of the first electrode, wherein the VCSEL die is positioned between the submount and the bottom substrate;
  a thermally conductive pathway comprising:
    a thermal pad coupling the VCSEL die package to a thermal dissipater, wherein the thermal pad and the VCSEL die package are configured to transfer heat from the VCSEL die to the thermal dissipater, and the thermal dissipater configured to dissipate heat transferred from the VCSEL die; and
  an optical coupling coupled to the VCSEL die package, the optical coupling configured to direct light emitted from the VCSEL die through an aperture out of the light source package.

20. A vertical cavity surface emitting laser (VCSEL) die package comprising:
  a bottom substrate comprising a bottom contact pad electrically coupled to a bottom electrode on a bottom surface of a VCSEL die; and
  a submount comprising a submount contact pad electrically coupled to a first electrode on another surface of the VCSEL die, the submount contact pad overlapping a portion of the first electrode,
  wherein the VCSEL die is positioned between the submount and the bottom substrate, and the entire bottom surface of the VCSEL die is coupled with the bottom substrate, and the submount covers at least a portion of a top surface of the VCSEL die opposite the bottom surface and affixes the VCSEL die to the bottom substrate.

21. A vertical cavity surface emitting laser (VCSEL) die package comprising:
  a bottom substrate comprising a bottom contact pad electrically coupled to a bottom electrode on a bottom surface of a VCSEL die; and
  a submount comprising a submount contact pad electrically coupled to a first electrode on another surface of the VCSEL die, the submount contact pad overlapping a portion of the first electrode, and a recess is defined in the submount and a bottom surface of the submount comprises an inner bottom surface and an outer bottom surface below the inner bottom surface,
  wherein the VCSEL die is positioned between the submount and the bottom substrate in the recess overlapping the inner bottom surface.

22. A vertical cavity surface emitting laser (VCSEL) die package comprising:
  a bottom substrate comprising a bottom contact pad electrically coupled to a bottom electrode on a bottom surface of a VCSEL die;
  a submount comprising a submount contact pad electrically coupled to a first electrode on another surface of the VCSEL die, the submount contact pad overlapping a portion of the first electrode; and
  a flexible printed circuit board (PCB) coupled to at least one of the bottom substrate or the submount,
  wherein at least one of the bottom contact pad or the submount contact pad is coupled to a circuit on the flexible PCB and the VCSEL die is positioned between the submount and the bottom substrate.

* * * * *

UNITED STATES PATENT AND TRADEMARK OFFICE
CERTIFICATE OF CORRECTION

PATENT NO. : 11,355,901 B1
APPLICATION NO. : 16/725365
DATED : June 7, 2022
INVENTOR(S) : Jonatan Ginzburg It is certified that error appears in the above-identified patent and that said Letters Patent is hereby corrected as shown below:

In the Claims

In Column 16, Claim 1, Line 22, delete "electrode and" and insert -- electrode; and --, therefor.

In Column 16, Claim 1, Line 26, delete "substrate and" and insert -- substrate, and --, therefor.

In Column 16, Claim 7, Lines 51-52, delete "surface VCSEL" and insert -- surface of the VCSEL --, therefor.

In Column 17, Claim 14, Line 17, delete "VCSELS." and insert -- VCSELs. --, therefor.

In Column 17, Claim 19, Line 37, delete "surface mitting" and insert -- surface emitting --, therefor.

Signed and Sealed this
Thirtieth Day of August, 2022

Katherine Kelly Vidal
*Director of the United States Patent and Trademark Office*